(12) United States Patent
Kholodenko et al.

(10) Patent No.: US 8,739,805 B2
(45) Date of Patent: Jun. 3, 2014

(54) CONFINEMENT OF FOAM DELIVERED BY A PROXIMITY HEAD

(75) Inventors: Arnold Kholodenko, San Francisco, CA (US); Cheng-Yu (Sean) Lin, Sunnyvale, CA (US); Leon Ginzburg, Santa Clara, CA (US); Mark Mandelboym, Santa Clara, CA (US); Gregory A. Tomasch, Kelseyville, CA (US); Anwar Husain, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 643 days.

(21) Appl. No.: 12/324,316

(22) Filed: Nov. 26, 2008

(65) Prior Publication Data

US 2010/0126528 A1   May 27, 2010

(51) Int. Cl.
 *B08B 3/04* (2006.01)
(52) U.S. Cl.
 USPC ....... 134/94.1; 134/95.1; 134/95.3; 134/99.1; 134/902
(58) Field of Classification Search
 CPC ... B08B 3/003; C11D 11/0058; B05B 7/0018
 USPC .............. 134/94.1, 95.1, 95.3, 99.1, 902
 See application file for complete search history.

(56) References Cited

U.S. PATENT DOCUMENTS

| 3,831,859 | A * | 8/1974 | Allard ........................ 239/592 |
| 6,230,722 | B1 * | 5/2001 | Mitsumori et al. ........ 134/122 R |
| 7,350,316 | B2 | 4/2008 | Woods et al. |
| 2004/0060581 | A1 | 4/2004 | Garcia et al. |
| 2006/0128600 | A1 * | 6/2006 | Freer et al. ................ 510/491 |
| 2007/0023070 | A1 * | 2/2007 | Woods et al. ................ 134/26 |
| 2007/0155640 | A1 * | 7/2007 | Freer et al. ................ 510/175 |

FOREIGN PATENT DOCUMENTS

| EP | 1803503 A2 * | 7/2007 |
| EP | 1803804 A2 * | 7/2007 |
| JP | 2007-208247 A9 | 8/2007 |
| WO | 2008097438 A1 | 8/2008 |
| WO | WO 2008-097438 A1 | 8/2008 |

OTHER PUBLICATIONS

LAM2P640.P International Search Report mailed on Jun. 18, 2010 (attached).

* cited by examiner

*Primary Examiner* — Michael Kornakov
*Assistant Examiner* — Douglas Lee
(74) *Attorney, Agent, or Firm* — Martine Penilla Group, LLP

(57) ABSTRACT

In an example embodiment, a linear wet system includes a carrier and a proximity head in a chamber. The proximity head includes three sections in a linear arrangement. The first section suctions liquid from the upper surface of a semiconductor wafer as the wafer is transported by the carrier under the proximity head. The second section is configured to cause a film (or meniscus) of cleaning foam which is a non-Newtonian fluid to flow onto the upper surface of the wafer. The third section is configured to cause a film of rinsing fluid to flow onto the upper surface of the wafer as the wafer is carried under the proximity head. The third section is defined partially around the second section and up to the first section, so that the third section and the first section create a confinement of the cleaning foam with respect to the chamber.

8 Claims, 18 Drawing Sheets

CONFINEMENT OF FOAM DELIVERED BY A PROXIMITY HEAD

BACKGROUND

Due to advances in device scaling for semiconductors, semiconductor device features have become smaller at the same time their aspect ratios have become larger. Consequently, semiconductor-device structures have become susceptible to damage from wet cleaning and drying. This susceptibility is exacerbated by the use of new materials in the process flows for semiconductor manufacturing.

In response to this susceptibility and other shortcomings in the technology for wet cleaning and drying, a system has been developed that uses mechanical and chemical cleaning to selectively remove residue without damage to semiconductor-device structures. This system transports a single semiconductor wafer linearly between an opposing pair of proximity heads that deliver a cleaning fluid to the wafer in an exposure time on the order of a few seconds.

In particular implementations, the cleaning fluid delivered by the opposing proximity heads is a high viscosity, non-Newtonian fluid in the form of a foam generated by mechanically mixing (a) a gas such as nitrogen (N2) and (b) a fluid containing water and a surfactant. See e.g., U.S. Published Patent Application No. 2006/0128600 entitled "Cleaning Compound and Method and System for Using the Cleaning Compound," filed on Feb. 3, 2006, U.S. application Ser. No. 11/820,590 entitled "System, Method and Apparatus for Maintaining Separation of Liquids in a Controlled Meniscus" filed on Jun. 19, 2007, and U.S. application Ser. No. 12/185,780 entitled "Generator for Foam to Clean Substrate," filed on Aug. 4, 2008. The disclosures of all three of these applications are hereby incorporated by reference.

If the surfactant is allowed to escape into the system's chamber during the deposition of the foam onto the semiconductor wafer, the surfactant can dry into a solid and contaminate later semiconductor wafers processed by the system. Consequently, a need exists for an inexpensive and effective means of confining the cleaning foam during its deposition onto a semiconductor wafer by the system. However, the invention claimed below has wide applicability to other applications beyond this particular application, as will become apparent from the following description and drawings.

SUMMARY

In an example embodiment, a linear wet system includes a carrier and a proximity head in a chamber. The carrier includes pins on which a semiconductor wafer rests, exposing both surfaces of the wafer as the wafer is transported through the system. The proximity head might be positioned above, below, or on both sides of the carrier. In this example embodiment, the proximity head might include three sections in a linear arrangement. The first section suctions liquid from the upper surface of the wafer as the wafer moves under the proximity head. The second section, which is contiguous to the first section, causes a film (or meniscus) of cleaning foam to flow onto the upper surface of the wafer as the wafer proceeds under the head. The third section, which is contiguous to the second section, causes a film (or meniscus) of rinsing fluid to flow onto the upper surface of the wafer as the wafer is carried under the proximity head. In this example embodiment, the third section is partially defined around the second section and up to the first section so that the third section and the first section create a confinement of the cleaning foam in the second section In another example embodiment, a linear wet system includes a carrier and a proximity head in a chamber. The carrier includes pins on which a semiconductor wafer rests, exposing surfaces of the wafer as the wafer is transported through the system. The proximity head might be positioned above and/or below the carrier. In this example embodiment, the proximity head might include two sections in a linear arrangement. The first section suctions liquid from the upper surface of the wafer as the wafer moves under the proximity head. The second section, which is contiguous to the first section, causes a film (or meniscus) of cleaning foam to flow onto the upper surface of the wafer as the wafer proceeds under the head. In this example embodiment, the cleaning foam from is prevented from escaping into the chamber by a barrier of suction surrounding the cleaning foam.

In another example embodiment, an automated method for a linear wet system includes three operations. In the method's first operation, a first section in a proximity head suctions liquid from the upper surface of a semiconductor wafer as the wafer is transported by a carrier under the proximity head in a chamber. In the method's second operation, a second section in a proximity head, contiguous to the first section, causes a film (or meniscus) of cleaning foam to flow onto the upper surface of the wafer as the wafer proceeds under the head. In the method's third operation, a third section in the proximity head, contiguous to the second section, causes a film (or meniscus) of rinsing fluid to flow onto the upper surface of the wafer as the wafer is carried under the proximity head. In this example embodiment, the third section is partially defined around the second section and up to the first section so that the third section and the first section create a confinement of the cleaning foam in the second section.

The advantages of the present invention will become apparent from the following detailed description, which taken in conjunction with the accompanying drawings, illustrates by way of example the principles of the invention.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, implementation details and process operations have not been described in detail, if already well known.

Figure 1A:
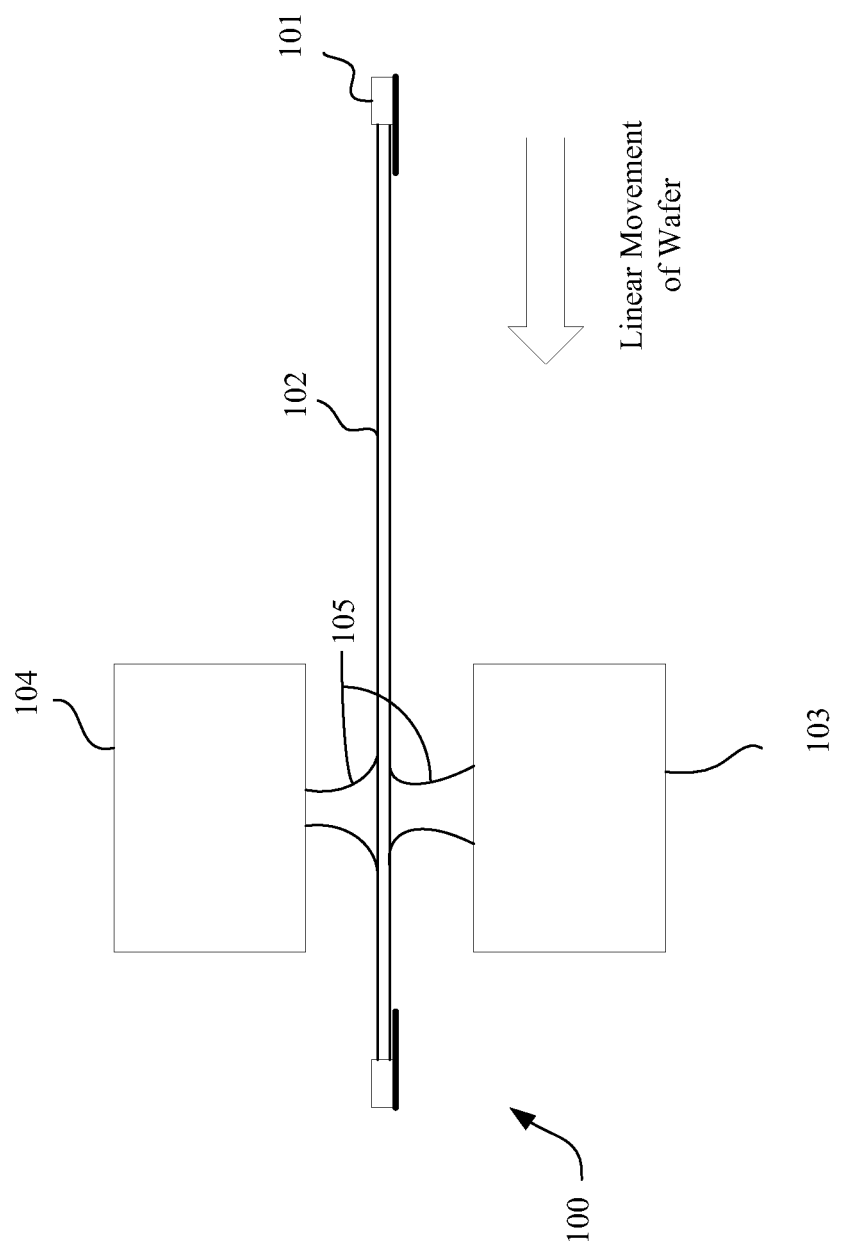
FIG. 1A is a simplified schematic diagram illustrating a linear wet system with a pair of proximity heads for depositing fluid onto a semiconductor wafer, in accordance with an example embodiment.

FIG. 1A is a simplified schematic diagram illustrating a linear wet system with a pair of proximity heads for depositing cleaning fluid onto a semiconductor wafer, in accordance with an example embodiment. In FIG. 1A, a linear wet system 100 includes a top proximity head 104 and a bottom proximity head 103. Each of these proximity heads forms a fluid meniscus 105 through which a semiconductor wafer 102 is linearly transported by a carrier 101 with pins on which the semiconductor wafer rests, exposing its surfaces. In an example embodiment, the fluid is a foam created by mechanically mixing a gas (such as nitrogen) and a fluid (an aqueous solution with a surfactant such as a fatty acid capable of forming micelles) in the generator described in U.S. application Ser. No. 12/185,780, incorporated by reference above. As explained in that application, the term "P2" refers to the two phases of matter that are present in the fluid input to the generator, e.g., liquid water and solid surfactant. The term "P3" refers to the three phases of matter that are present in the foam output by the generator, e.g., liquid water, solid surfactant, and gaseous nitrogen (N2). In an example embodiment, P3 is a high viscosity (in the range of 200-2000 cP or centipoise), non-Newtonian fluid. The hydraulic properties of P3 are fundamentally different from a regular Newtonian fluid, such as water. P3 can be generalized as pseudo-plastic material where the fluid viscosity decreases with increasing shear rate (e.g., it is "shear-thinning").

It will be appreciated that the fluid meniscus 105 does not confine the P3 so as to prevent it from escaping into the chamber that houses the carrier 101 and the proximity heads 103 and 104, where the P3 might dry and release the solid surfactant as a contaminant in the linear wet system. In an example embodiment, the solid surfactant might be stearic acid, though other fatty acids can be used as alternatives as explained in U.S. Published Patent Application No. 2006/0128600, incorporated by reference above. Those other fatty acids include lauric, palmitic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, and clupanodonic acid, either alone or in combination with themselves or with stearic acid.

Figure 1B:
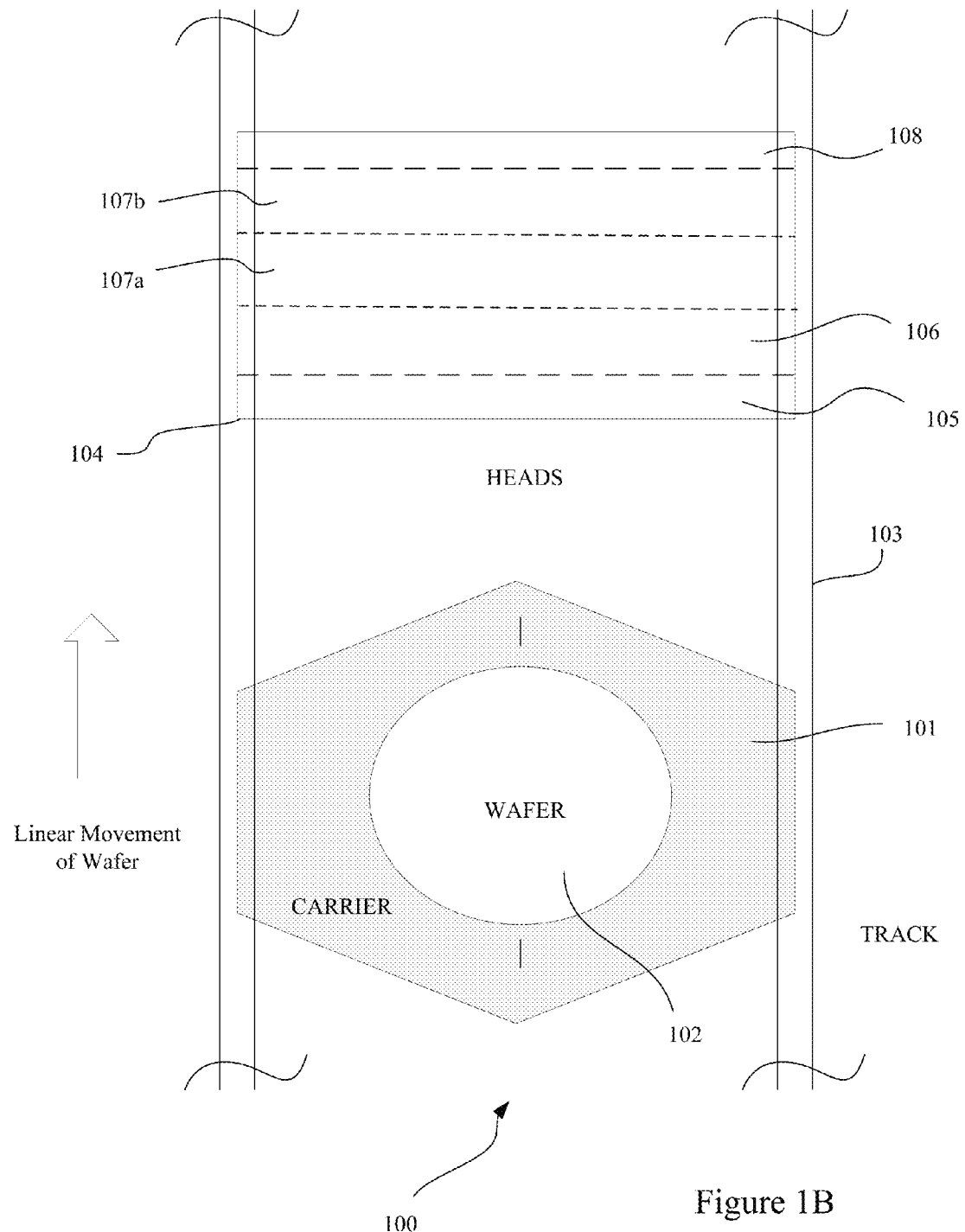
FIG. 1B is a simplified schematic diagram illustrating an overhead view of a carrier and a proximity head in a linear wet system, in accordance with an example embodiment.

FIG. 1B is a simplified schematic diagram illustrating an overhead view of a carrier and a proximity head in a linear wet system, in accordance with an example embodiment. As shown in this figure, a carrier 101 as described above transports a semiconductor wafer 102 along a pair of tracks 103 in a linear wet system 100, beneath a top proximity head 104. In this example embodiment, the top proximity head 104 includes five component heads: (a) a conditioning head 105, which is optional and which might perform rinsing and/or suctioning and/or drying; (b) an AMC (Advanced Mechanical Cleaning) head 106, which deposits and suctions P3; (c) two C3 (Confined Chemical Cleaning) heads, 107a and 107b, which deposit and suction other chemical cleaning fluids; and (d) an exit head 108, which might perform rinsing and/or suctioning and/or drying.

Figure 2:
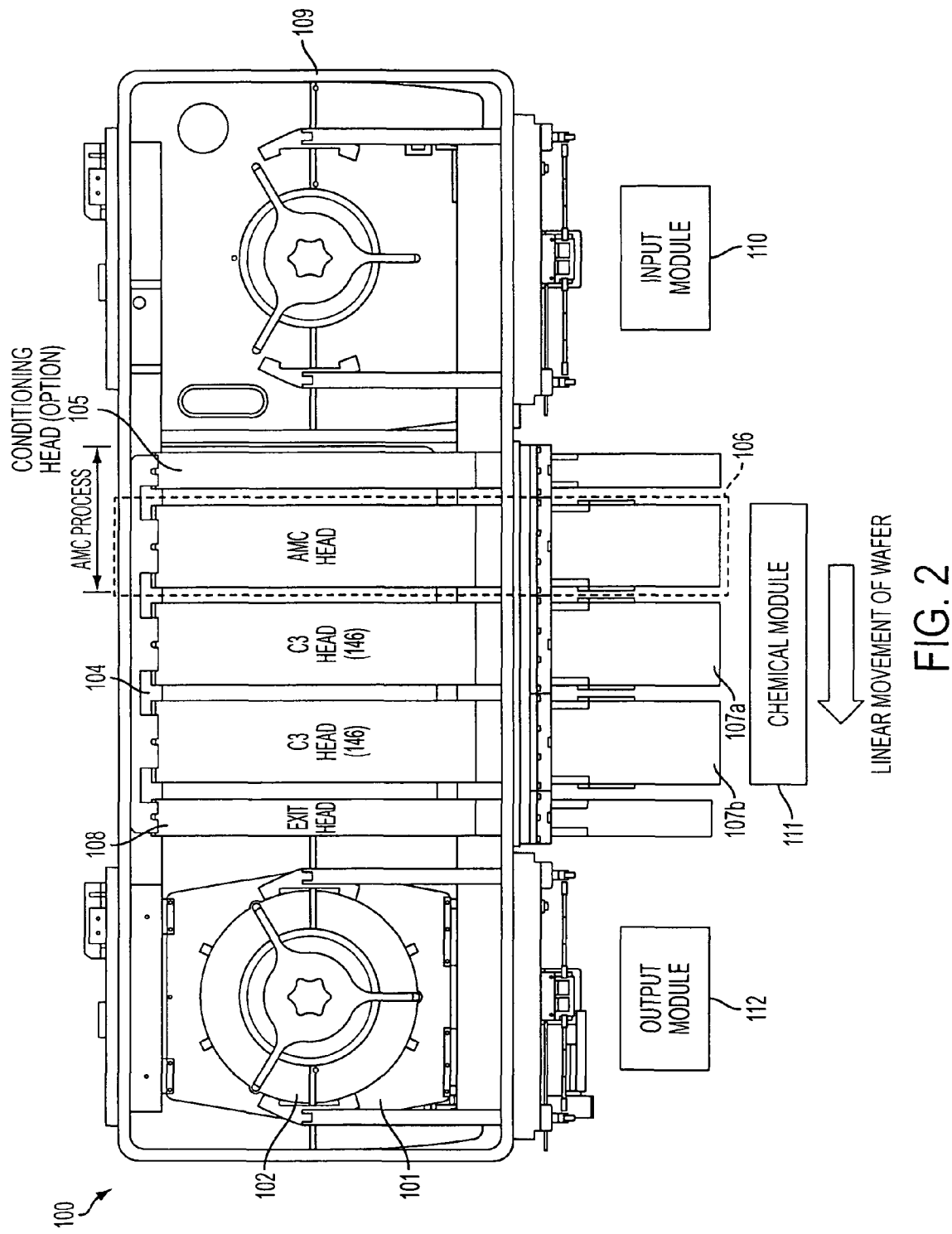
FIG. 2 is a diagram illustrating an overhead view of the sections in a linear wet system, in accordance with an example embodiment.

FIG. 2 is a diagram illustrating an overhead view of the modules in a linear wet system, in accordance with an example embodiment. As depicted in FIG. 2, the linear wet system 100 includes three modules: (1) an input module 110; (2) a chemical module 111; and (3) an output module 112. In turn, the chemical module 110 comprises a top proximity head 104 with five component heads 105, 106, 107a, 107b, and 108, as described above. In an example embodiment, the chemical module 111 might also comprise a bottom proximity head 103, which is not shown. A carrier 101 with a semiconductor wafer 102 is shown in the output module 112. Also shown in FIG. 2 is the chamber 109 which houses the input module 110, the chemical module 111, and the output module 112.

Figure 3:
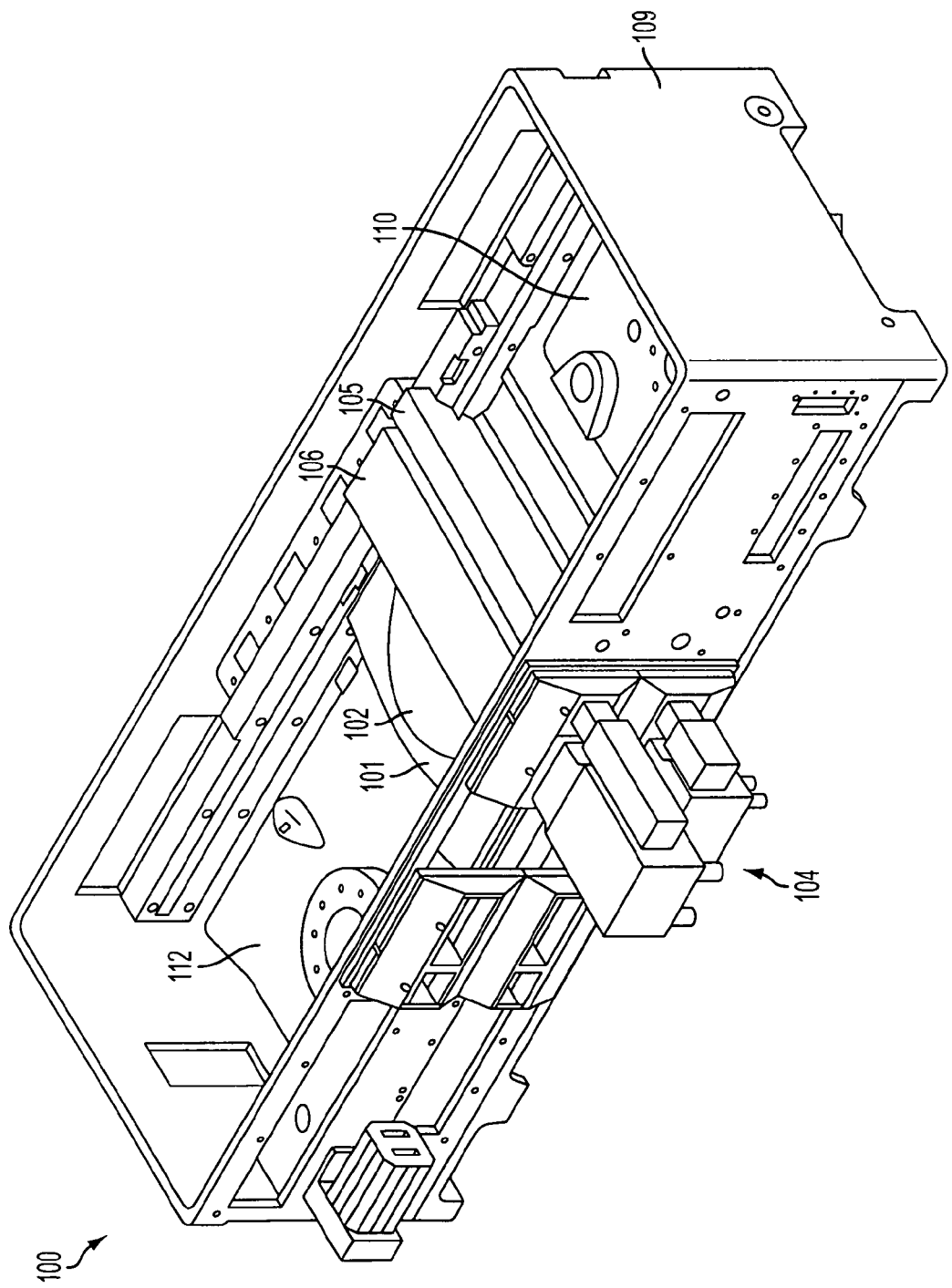
FIG. 3 is a diagram illustrating a perspective view of a carrier and a proximity head in a linear wet system, in accordance with an example embodiment.

FIG. 3 is a diagram illustrating a perspective view of a carrier and a proximity head in a linear wet system, in accordance with an example embodiment. As depicted in FIG. 3, a carrier 101 is transporting a semiconductor wafer 102 from an input module 110 to an output module 112. The wafer 102 passes beneath a proximity head 104 which includes two head components: a conditioning head 105 and an AMC head 106. The other component heads described above are not shown, though they might be included in the proximity head 104, in an example embodiment.

Figure 4:
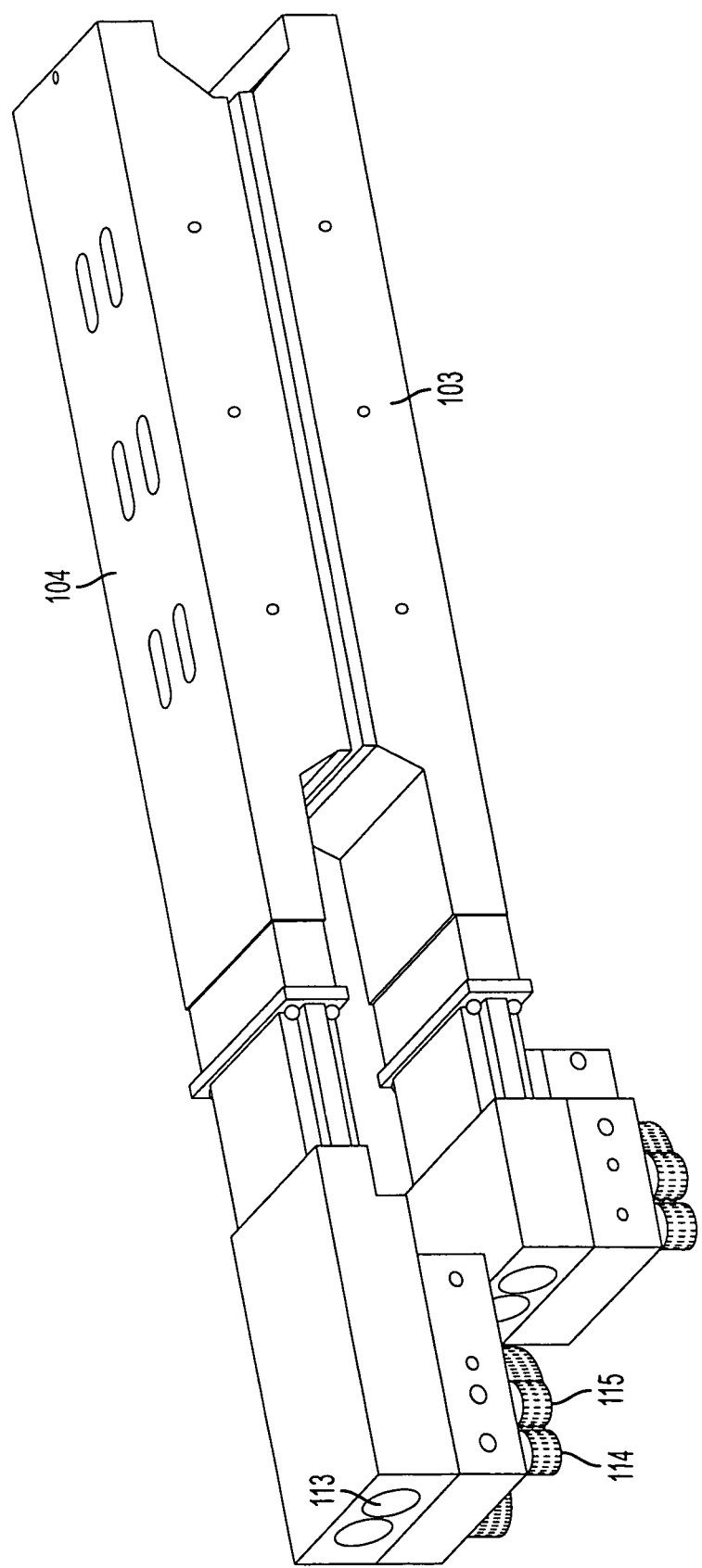
FIG. 4 is a diagram illustrating a perspective view of a pair of proximity heads in a linear wet system, in accordance with an example embodiment.

FIG. 4 is a diagram illustrating a perspective view of a pair of proximity heads in a linear wet system, in accordance with an example embodiment. Both the top proximity head 104 and the bottom proximity head 103 are shown in this figure. In an example embodiment, the top proximity head includes a P3 generator 113, which is readily removed for easy cleaning, as described in greater detail in U.S. application Ser. No. 12/185,780, incorporated by reference above. In an example embodiment, the P3 generator 113 might receive P2 (e.g., water and stearic acid) through the input 114 and a gas (e.g., nitrogen or N2) through the input 115 and produces P3 by mixing them in a sealed helical channel which is not shown.

Figure 5:
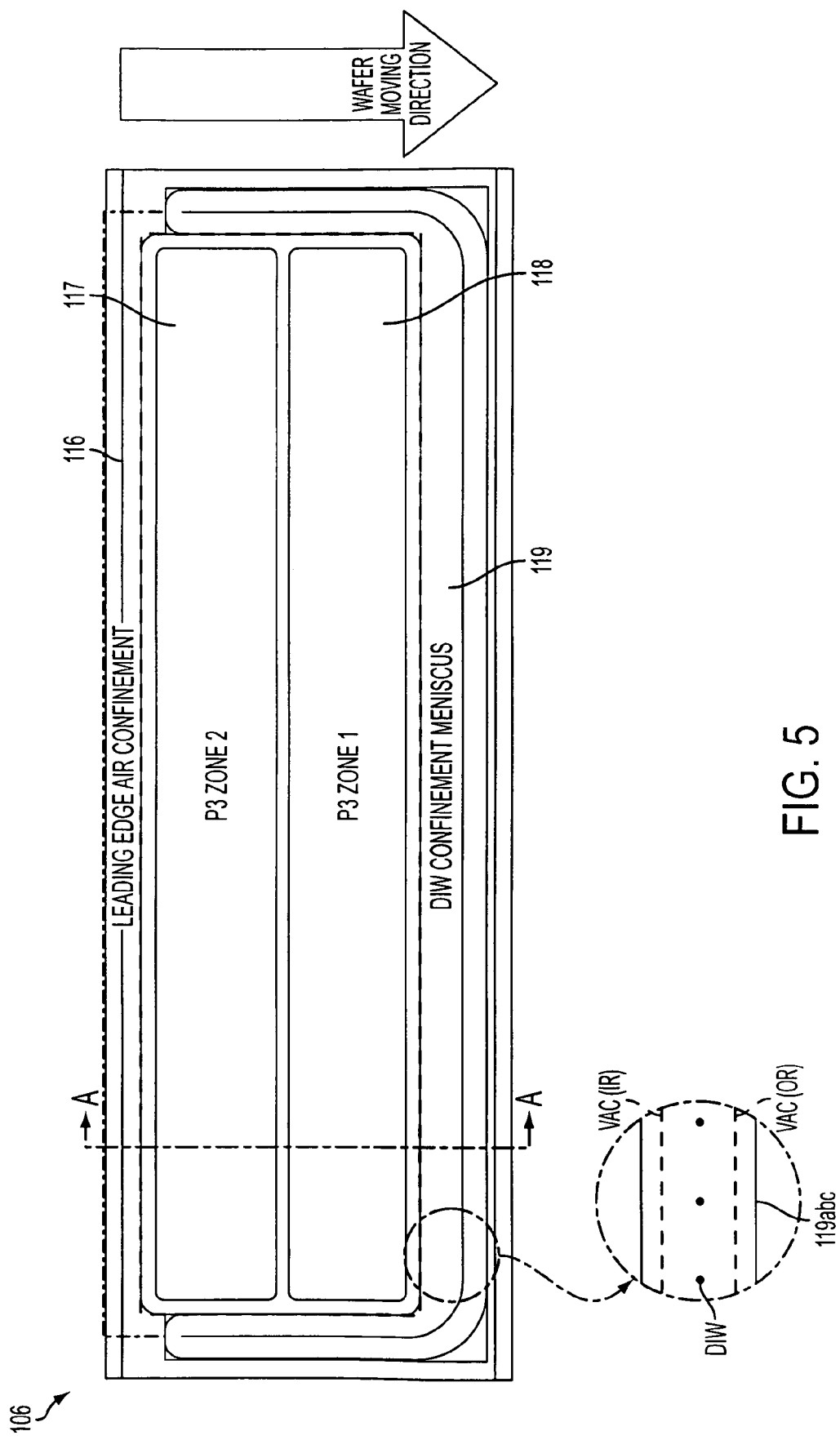
FIG. 5 is a schematic diagram illustrating the sections of an AMC head, in accordance with an example embodiment.

FIG. 5 is a schematic diagram illustrating the sections of an AMC head, in accordance with an example embodiment. As depicted in FIG. 5, an AMC head 106 includes a first section 116 (depicted by a broken line with dots) comprising a structure for a leading edge air confinement which prevents P3 from escaping into the system's chamber by suctioning the P3 upward into head 106, as will be described in greater detail below. Additionally, the first section 116 facilitates the application of P3 to the surface of a semiconductor wafer, since P3 might work better as a cleaning fluid on a surface that is dry, rather than wet, in an example embodiment. As depicted in FIG. 5, the first section 116 is the initial section of the AMC head 106 encountered by a semiconductor wafer as it is carried through the linear wet system. The AMC head 106 also includes a second section (depicted with a broken line) which comprises two P3 zones, 117 (P3 Zone 2) and 118 (P3 Zone 1), where the head 106 deposits P3 onto and suctions P3 from the wafer (e.g., using a partial vacuum). In an example embodiment, the P3 deposited in zone 117 might have a different composition than the P3 deposited in zone 118, e.g., a different relative percentage of P2 to gas (e.g., nitrogen or N2). It will be appreciated that multiple P3 zones allow for a degree of variability and control in a linear wet system that tends to be somewhat fixed.

The AMC head 106 shown in FIG. 5 also includes third section 119 (depicted with a solid line) comprising the structure for a confinement meniscus, created by flowing deionized water (DIW). As shown in the figure, the third section 119 extends around the second section (e.g., P3 zones 117 and 118) all the way to the first section 116, creating an enclosure of the P3 flowing in the second section. In this regard, it will be appreciated that both the top proximity head 104 and the bottom proximity head 103 might create DIW confinement meniscuses and leading edge air confinements which are matching and contiguous before entry of a semiconductor wafer, in an example embodiment. More details of the third section 119 are depicted in 119abc, a schematic close-up view. As shown in that close-up view, the third section 119 might include an interior input channel that deposits a rinsing fluid such as DIW onto a surface of a semiconductor wafer and an inner return (IR) channel and an outer return (OR) channel that suction the rinsing fluid off of the surface (e.g., using a partial vacuum).

Figure 6:
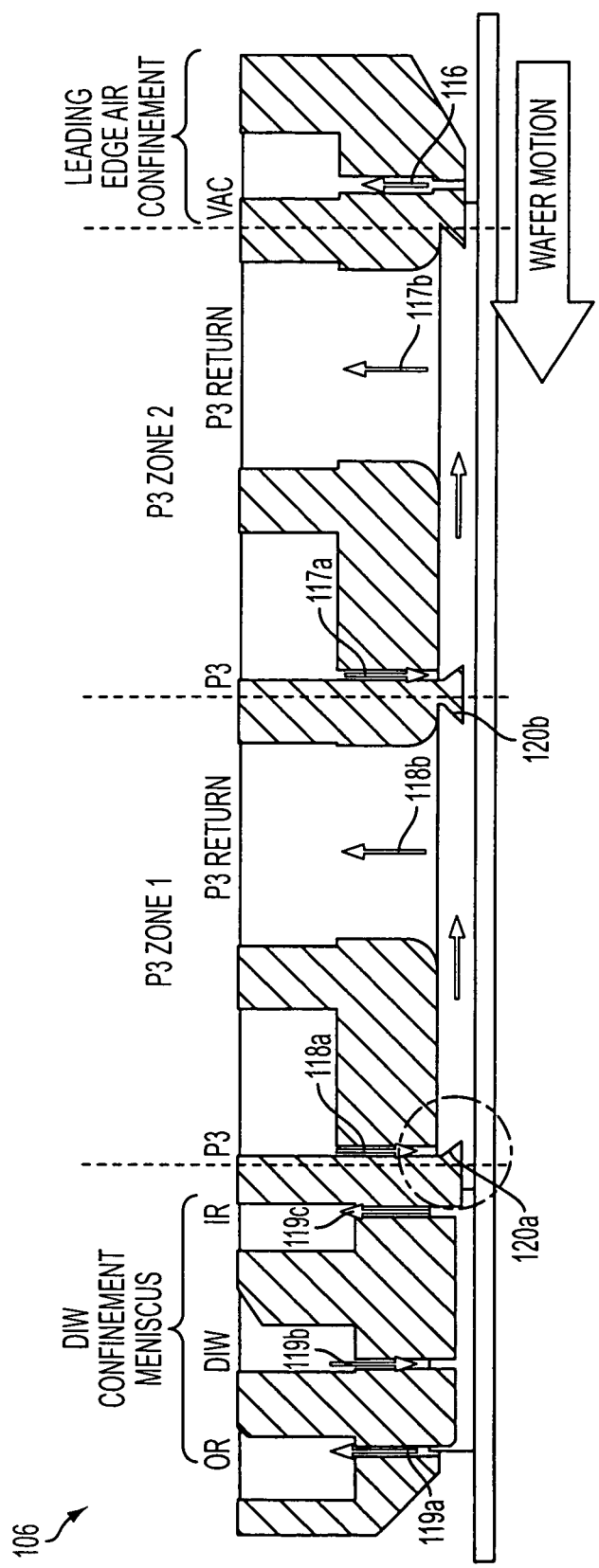
FIG. 6 is a schematic diagram illustrating a cross-sectional view of the sections in an AMC head, in accordance with an example embodiment.

FIG. 6 is a schematic diagram illustrating a cross-sectional view of the sections in an AMC head, in accordance with an example embodiment. It will be appreciated that FIG. 6 corresponds to the A-A cutting plane in FIG. 5. As depicted in FIG. 6, the first section 116 employs a vacuum to suction P3 up into the AMC head 106. As noted above and as depicted in this figure, the first section 116 is the initial part of the AMC head encountered by a semiconductor wafer as it is carried through the linear wet system. As the wafer exits the first section 116, the wafer enters P3 Zone 2 of the second section, where the AMC head 106 flows P3 from input channel 117a to return channel 117. Then, as the wafer exits P3 Zone 2, the wafer enters P3 Zone 1 of the second section, where the AMC head 106 flows P3 from input channel 118a to return channel 118b. As noted earlier, the composition of the P3 in Zone 1 might be different than the composition of the P3 in Zone 2, in an example embodiment. As the wafer exits P3 Zone 1, the wafer enters the third section, where the AMC head 106 flows DIW from input channel 119b to OR channel 119a and IR channel 119c. In an example embodiment, the wafer might be wet when it emerges from the meniscus (e.g., DIW flowing from an input channel to an OR and an IR) in the third section. It will also be appreciated that the wafer might enter another meniscus or a partial vacuum upon exiting the third section, as indicated by the earlier description of the chemical module 111.

Also depicted in FIG. 6 is a deflecting edge 120a which deflects the flow of P3 as it leaves the AMC head 106 through input channel 118a, as described in further detail below. It will be appreciated that inner return channel 119c might also return some of the P3 deposited by input 118a, in an example embodiment. That is to say, inner return channel 119c is a "mixed inner return".

Figure 7:
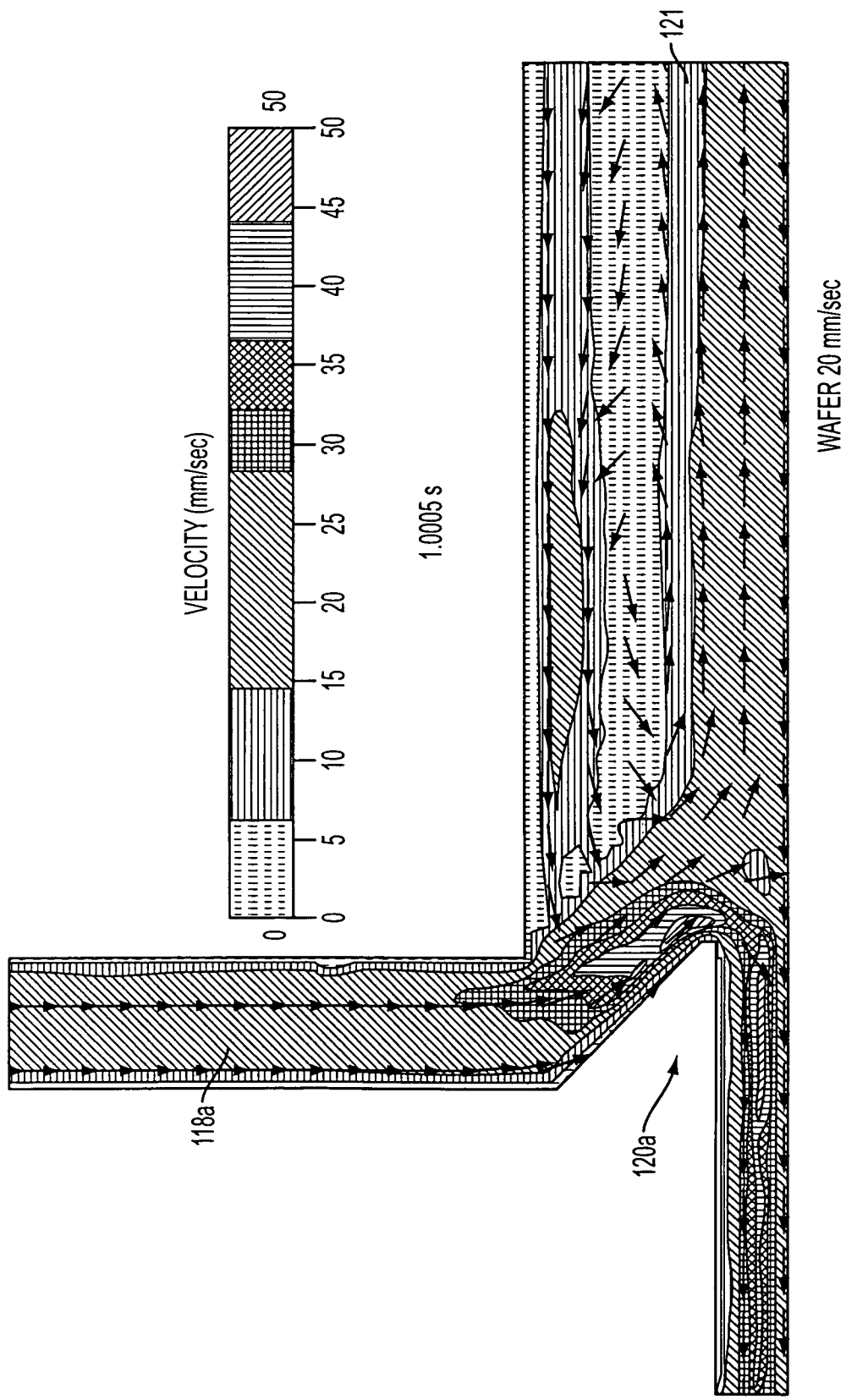
FIG. 7 is a schematic diagram illustrating a cross-sectional view of the deflected flows of a cleaning fluid (e.g., P3) deposited by an AMC head, in accordance with an example embodiment.

FIG. 7 is a schematic diagram illustrating a cross-sectional view of the deflected flows of a cleaning fluid (e.g., P3) deposited by an AMC head, in accordance with an example embodiment. It will be appreciated that FIG. 7 depicts the area that is circled in FIG. 6, e.g., the area that contains deflecting edge 120a. As depicted in FIG. 7, deflecting edge 120a deflects P3 as it flows from input channel 118a into a P3 meniscus 121, where a circular flow is created due to an opposing deflecting edge (shown as 120b in FIG. 6). Also as depicted in FIG. 7, an amount of P3 flows to the left of the deflecting edge 120a to an inner return channel in the third section of the AMC head. This amount is relatively small in comparison to the amount of P3 which flows into the circular flow in the P3 meniscus and ultimately into return channel 118b.

It will be appreciated that the deflecting edge 120a protects the semiconductor wafer from damage caused by direct downward flow onto the surface of the wafer. Further, the deflecting edge 120a and its opposing deflecting edge 120b physically confine the P3 meniscus 121, through creation of a circular flow, among other things. In turn, this physical confinement reduces the flow of P3 to the "mixed inner return" 119c, which is responsible for suctioning the DIW in the DIW confinement meniscus.

Also shown in FIG. 7 are the velocities (in mm/sec) for the P3 flows. The semiconductor wafer flows toward the left side of the figure (see FIG. 6) at a velocity of about 20 mm/sec. In an example embodiment, P3 flows down input channel 118a at a velocity in a range of 5-30 mm/sec, until the P3 encounters the deflecting edge 120a. At this point, the velocity of most of the P3 increases so that the velocity is in a range of 25-45 mm/sec. This increased velocity is maintained by much of the P3 flowing left toward the inner return channel 119c in the third section. Most of the P3 flowing into the P3 meniscus 121 decreases in velocity, to a range of 15-30 mm/sec. The velocity of the P3 decreases further as it is deflected back into the circular flow of the P3 meniscus by the opposing deflecting edge 120b (not shown), to a range of 0-15 mm/sec.

Figure 8:
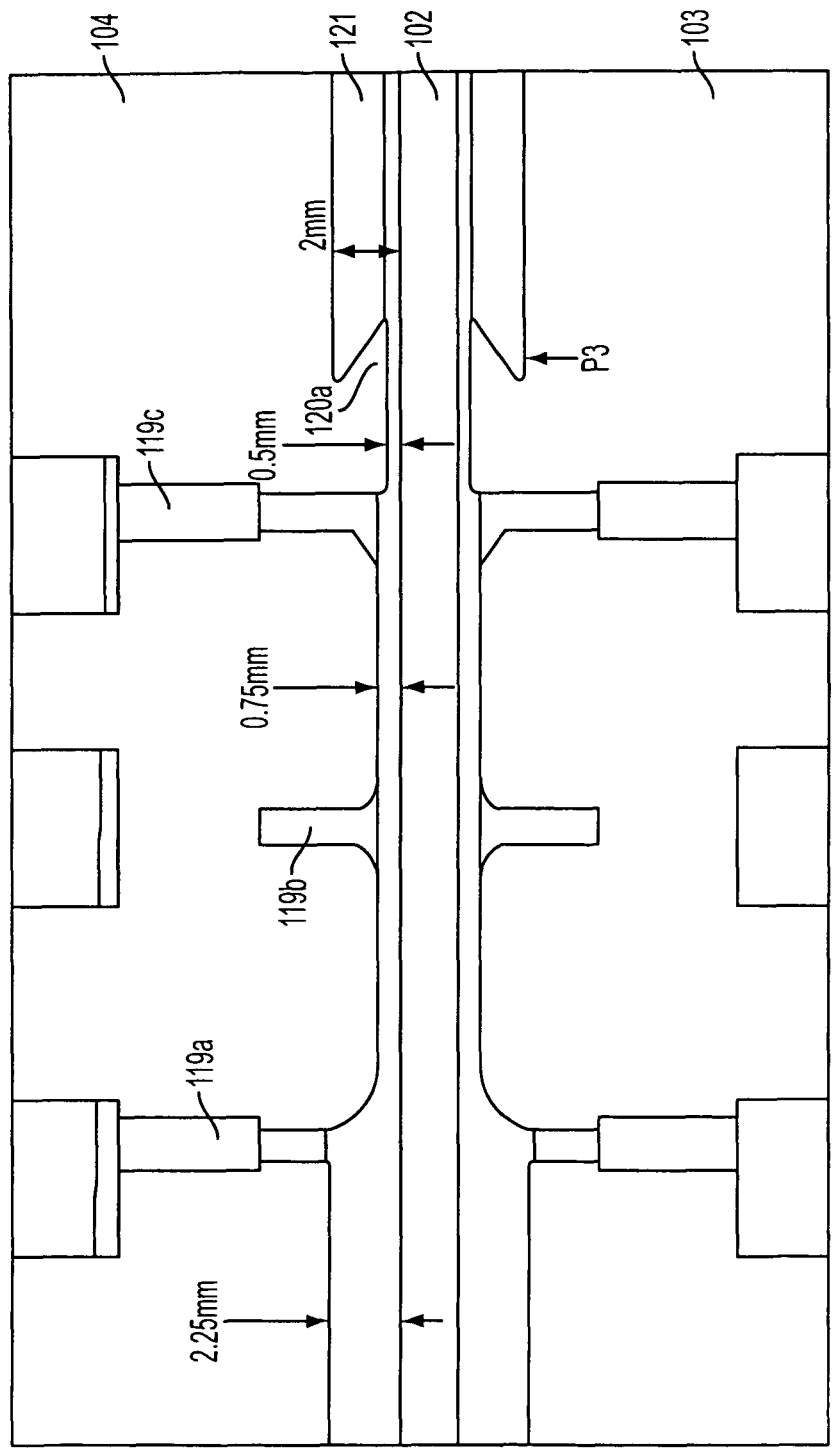
FIG. 8 is a schematic diagram illustrating several dimensions relating to an AMC head, in accordance with an example embodiment.

FIG. 8 is a schematic diagram illustrating several dimensions relating to an AMC head, in accordance with an example embodiment. The figure shows a semiconductor wafer 102 between the AMC head in a top proximity head 104 and the AMC head in a bottom proximity head 103. As depicted in the figure, the gap between the wafer 102 and the AMC head at the outer return channel 119a (for the DIW confinement) is approximately 2.25 mm. The gap between the wafer 102 and the AMC head at the DIW input channel 119b (and the "mixed" inner return channel 119c) is approximately 0.75 mm. That is to say, the "process gap" for the third section is 0.75 mm, in an example embodiment. The gap between the wafer 102 and the AMC head at the deflecting edge 120a (e.g., for input channel 118a in P3 Zone 1) is approximately 0.5 mm. And the gap between the wafer 102 and the AMC head above the P3 meniscus 121 (for P3 Zone 1) is approximately 2 mm. That is to say, the "process gap" for the P3 meniscus is 2 mm, in an example embodiment. As depicted in this figure, P3 might flow from an input channel (not explicitly shown) in a bottom AMC head, as well as from an input channel (not explicitly shown) in a top AMC head.

Figure 9:
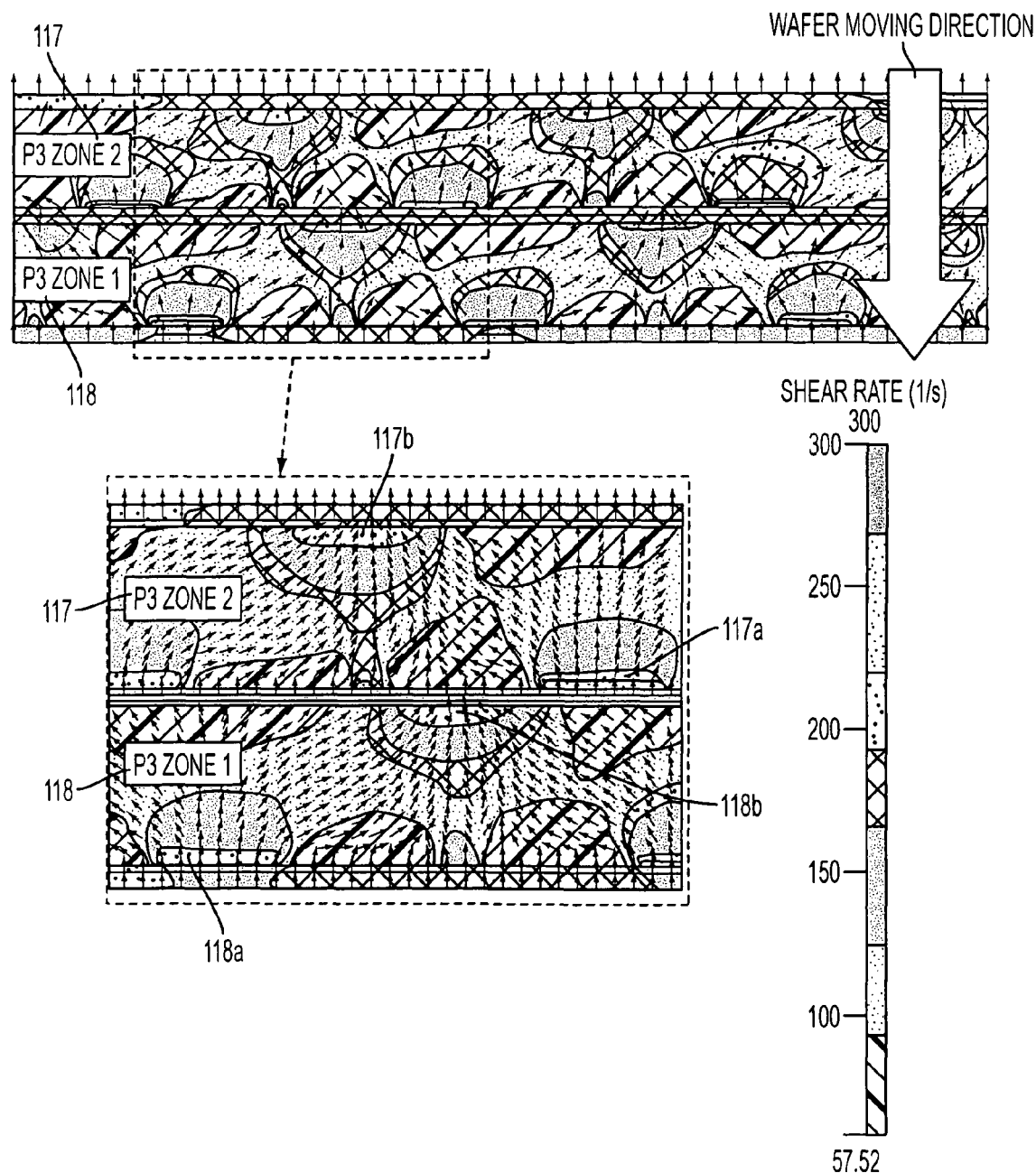
FIG. 9 is a schematic diagram illustrating the shear rates of the flows of a cleaning fluid (e.g., P3) deposited by an AMC head, in accordance with an example embodiment.

FIG. 9 is a schematic diagram illustrating the shear rates of the flows of a cleaning fluid (e.g., P3) deposited by an AMC head, in accordance with an example embodiment. As indicated in the figure, the unit of measurement for the shear rate is 1/s (1/sec), reciprocal or inverse seconds. The shear rates are shown for two contiguous P3 zones, 117 (P3 Zone 2) and 118 (P3 Zone 1). It will be appreciated that each of the two contiguous P3 zones might influence each other's shear rates, in an example embodiment. As indicated in the figure, a semiconductor wafer proceeding through the linear wet system might enter P3 zone 117 prior to P3 zone 118, in an example embodiment.

In P3 zone 117, P3 flows out of an input channel 117a across the bottom of an AMC head to a return channel 117b. Similarly, in P3 zone 118, P3 flows out of an input channel 118a across the bottom of an AMC head to a return channel 118b. As depicted in this figure, the shear rate of the P3 near an input channel is in a range of 175-275 reciprocal seconds. As the P3 spreads across the bottom of the AMC head, the shear rate of the P3 decreases to a range of 50-175 reciprocal seconds until the P3 nears a return channel, where the shear rate increase to a range of 125-225 reciprocal seconds.

It will be appreciated that both the staggered locations and the sizes of the input and return channels in P3 zones 117 and 118 create a radial flow pattern on the surface of the wafer that is gentle and non-directional with respect to shear rate. Such a radial flow pattern deposits P3 on the surface of the wafer without preferential direction in a manner that prevents damage to structures on the wafer.

Figure 10:
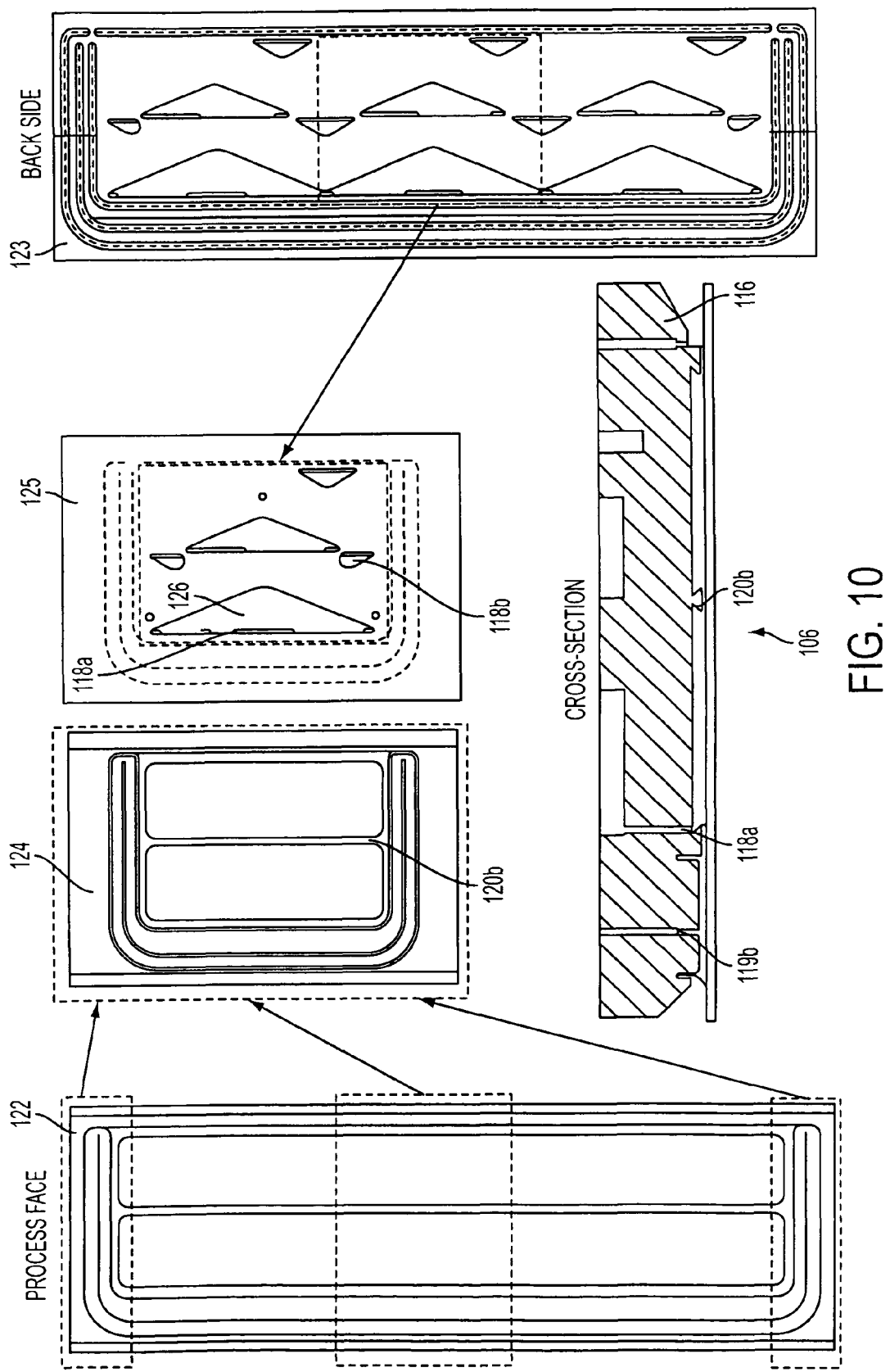
FIG. 10 is a schematic diagram illustrating the process face and the back side of the process face for an AMC head, in accordance with an example embodiment.

FIG. 10 is a schematic diagram illustrating the process face and back side of the process face for an AMC head, in accordance with an example embodiment. The figure shows a cross-section of an AMC head 106 as described earlier, comprising a first section 116, an input channel 118a for depositing P3, and an input channel 119b for depositing DIW. Also depicted in this figure is the process face 122 for the AMC head 106. It will be appreciated that the process face 122 is the surface of the head which is closest to the surface of a semiconductor wafer being processed by the linear wet system. For purposes of illustration, the figure also includes a composite process face 124, which is composed of the middle and two ends of the full process face 122. It will be appreciated that the process face 122 and the composite process face 124 are in all material respects similar to the AMC head 106 shown in FIG. 5 insofar as each process face includes a structure for creating a leading edge air confinement, two P3 zones, and a structure for creating a DIW confinement which (a) extends around the two P3 zones up to the leading edge air confinement and (b) which creates a DIW meniscus flowing from an input channel to an outer return (OR) and an inner return (IR). FIG. 10 also shows a deflecting edge 120b between the two P3 zones, which, as noted earlier, (a) helps contain a P3 meniscus within a P3 zone and (b) prevents the direct flow of P3 onto the surface of a semiconductor wafer.

Additionally, FIG. 10 illustrates the back side 123 of a process face 122 in an AMC head 106. For purposes of illustration, the figure also includes a composite back side 125, which is composed of the middle and two ends of the full back side 123. The composite back side 125 includes (a) a reservoir 126, which feeds an input channel 118a and will be described further below, and (b) a return 118b. It will be appreciated that P3 flows from the input channel 118a to the return 118b, as illustrated in FIG. 9 (relating to shear rates).

Figure 11:
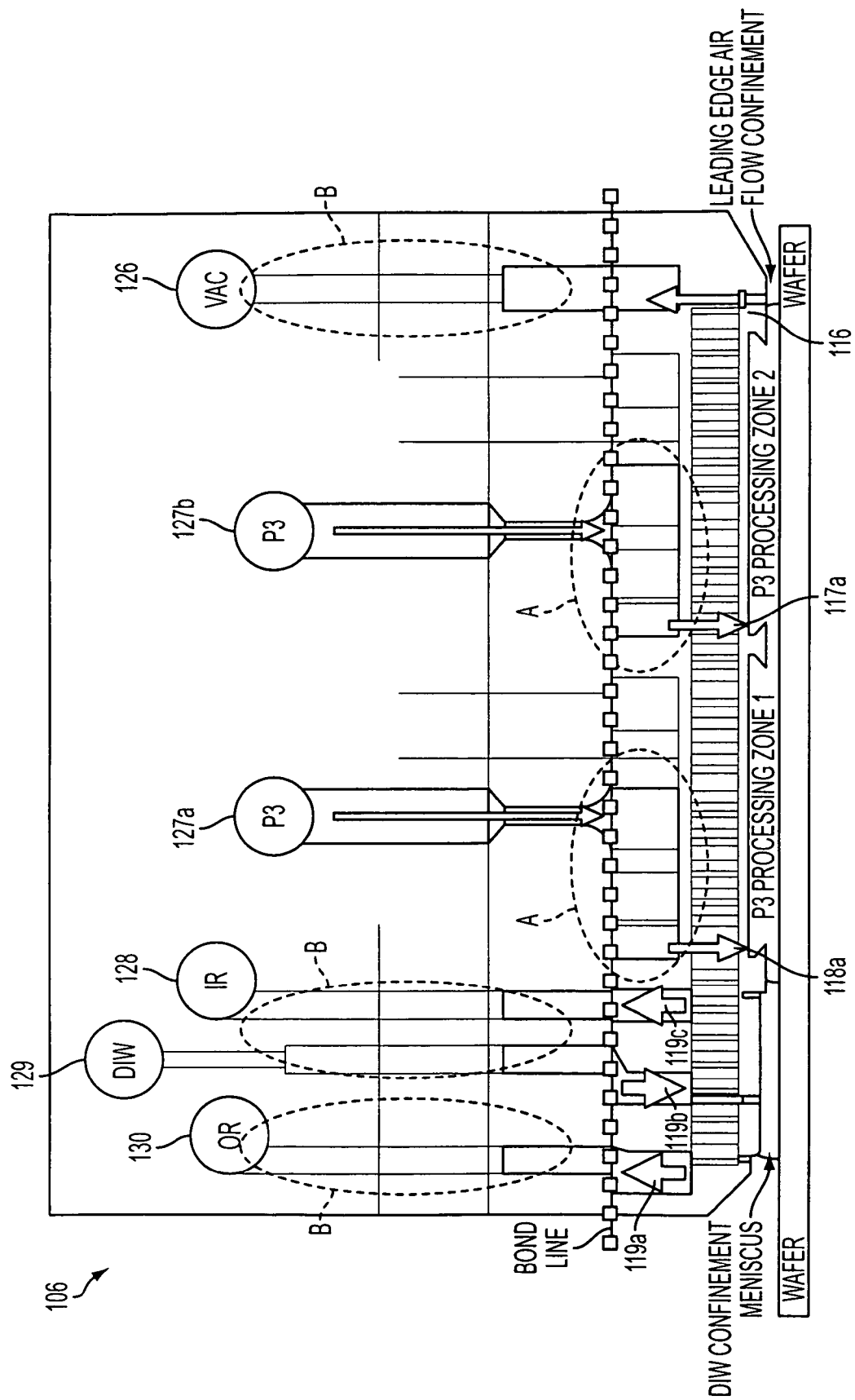
FIG. 11 is a schematic diagram illustrating two features in a cross-sectional view of an AMC head, in accordance with an example embodiment.

FIG. 11 is a schematic diagram illustrating two features in a cross-sectional view of an AMC head, in accordance with an example embodiment. The figure shows a cross-section of an AMC head 106 as described earlier, comprising a first section 116, an input channel 117a for depositing P3, an input channel 118a for depositing P3, a "mixed" inner return 119c for suctioning DIW and P3, an input channel 119b for depositing DIW, and an outer return 119a for suctioning DIW. Also depicted in this figure are the bores which provide P3, DIW, and suction to the AMC head 106. Bore 126 provides suction (e.g., VAC) to the first section 116. Bores 127a and 127b provide P3 to P3 Zone 1 and P3 Zone 2, respectively. Bore 129 provides DIW to the DIW confinement in the third section. IR bore 128 and OR bore 130 suction the DIW from the DIW confinement. As noted elsewhere, IR bore 128 also suctions some of the P3 deposited into P3 Zone 1.

FIG. 11 also depicts the bond line (e.g., resulting from thermal fusion) between the process face 122 and the back side 123 of the process face. Additionally, FIG. 11 shows two features A and B. Feature A comprises the reservoirs used to deposit P3, such as reservoir 126 in FIG. 10. Feature B comprises the down-feeds between a bore (e.g., bore 126, 128, 129, or 130) and its corresponding input or return channels.

Figure 12:
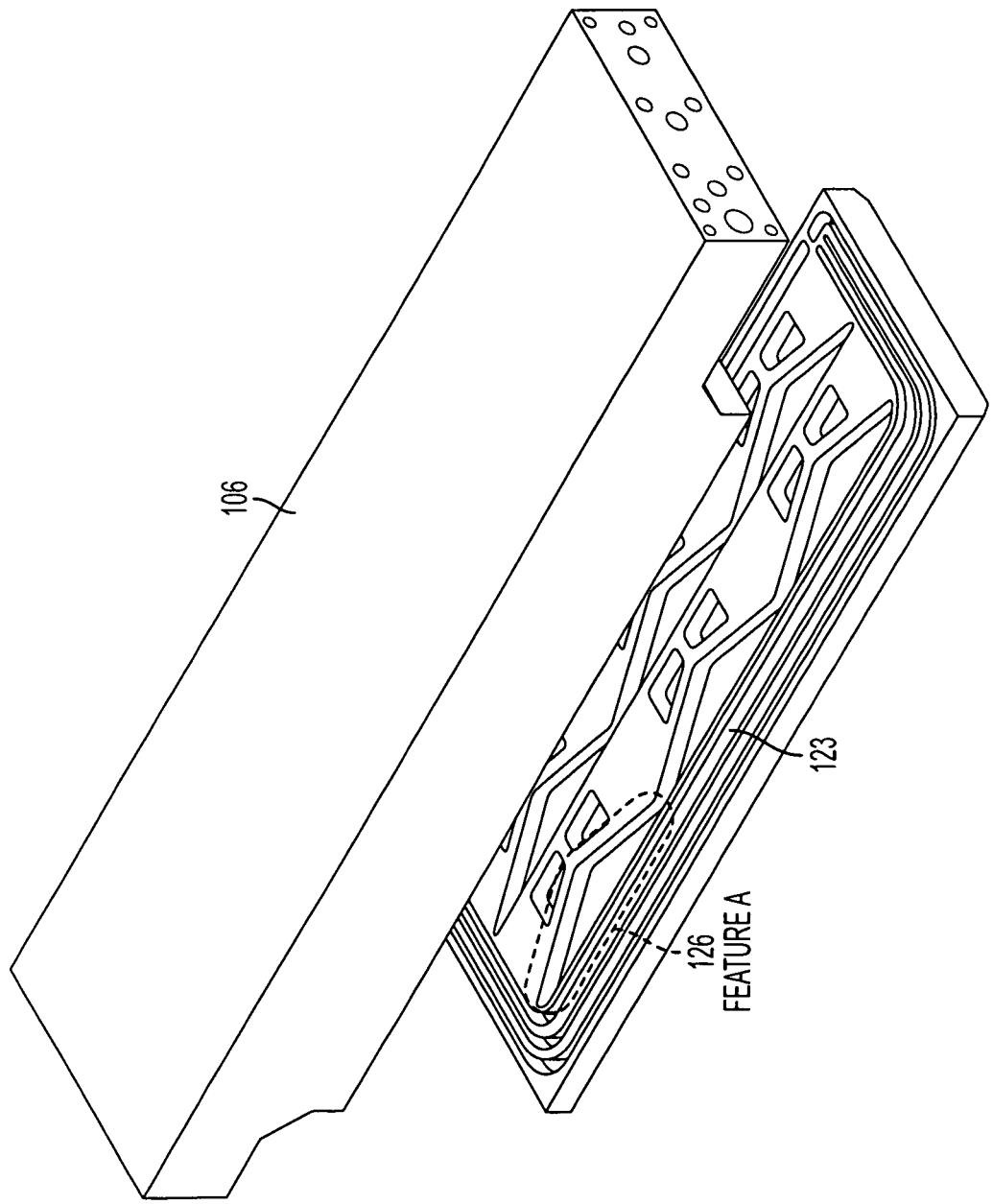
FIG. 12 is a schematic diagram illustrating the reservoirs in an AMC head, in accordance with an example embodiment.

FIG. 12 is a schematic diagram illustrating the reservoirs in an AMC head, in accordance with an example embodiment. This figure shows a perspective view of the back side 123 of a process face in an AMC head 106. As depicted in this figure, the back side 123 contains numerous reservoirs (e.g., reservoir 126) which store P3 as it flows down from a bore (e.g., 127a and 127b in FIG. 11) to a P3 meniscus on the process face of the AMC head 106. Similar reservoirs were shown in FIG. 10.

Figure 13:
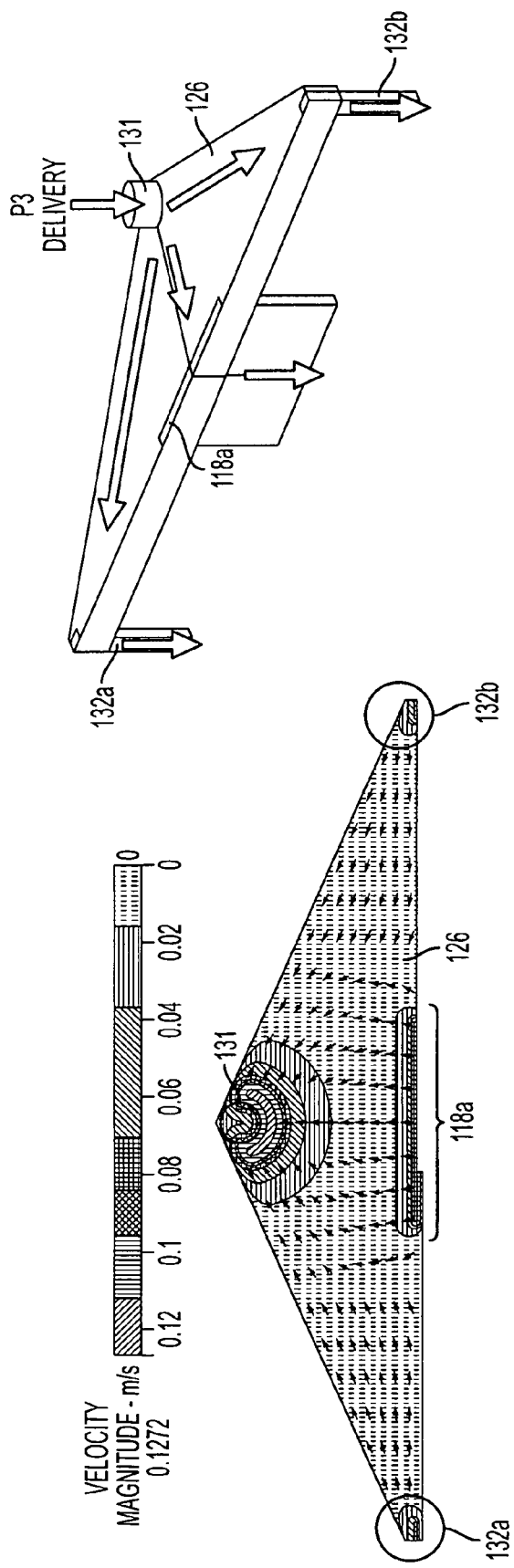
FIG. 13 is a schematic diagram illustrating the flows in a reservoir in an AMC head, in accordance with an example embodiment.

FIG. 13 is a schematic diagram illustrating the flows in a reservoir in an AMC head, in accordance with an example embodiment. As depicted in FIG. 13, a reservoir 126 in an AMC head receives P3 from a delivery passage 131 and buffers the P3 until it flows down to a P3 meniscus through input channels 118a, 132a, and 132b. The delivery passage 131 is connected to a P3 bore (e.g., 127a and 127b in FIG. 11). Parenthetically, input channels 132a and 132b are also somewhat visible in FIGS. 9 and 10, though they are relatively small in comparison to input channel 118a.

FIG. 13 also shows the velocity magnitude (in m/sec) for the P3 as it traverses the reservoir from the delivery passage 131 to the input channels 118a, 132a, and 132b. In the vicinity of the delivery passage 131, the velocity magnitude of the P3 is in the range of 0.02-0.08. As the P3 moves away from the delivery passage 131, the velocity magnitude of the P3 increases to a range of 0.08-1.2 and then decreases to a range of 0.02-0.07. In the middle of the reservoir, the velocity magnitude of the P3 is in the range of 0-0.04 and then increases to a range of 0.06-0.11 as the P3 approaches the input channels (e.g., 118a, 132a, and 132b).

Figure 14:
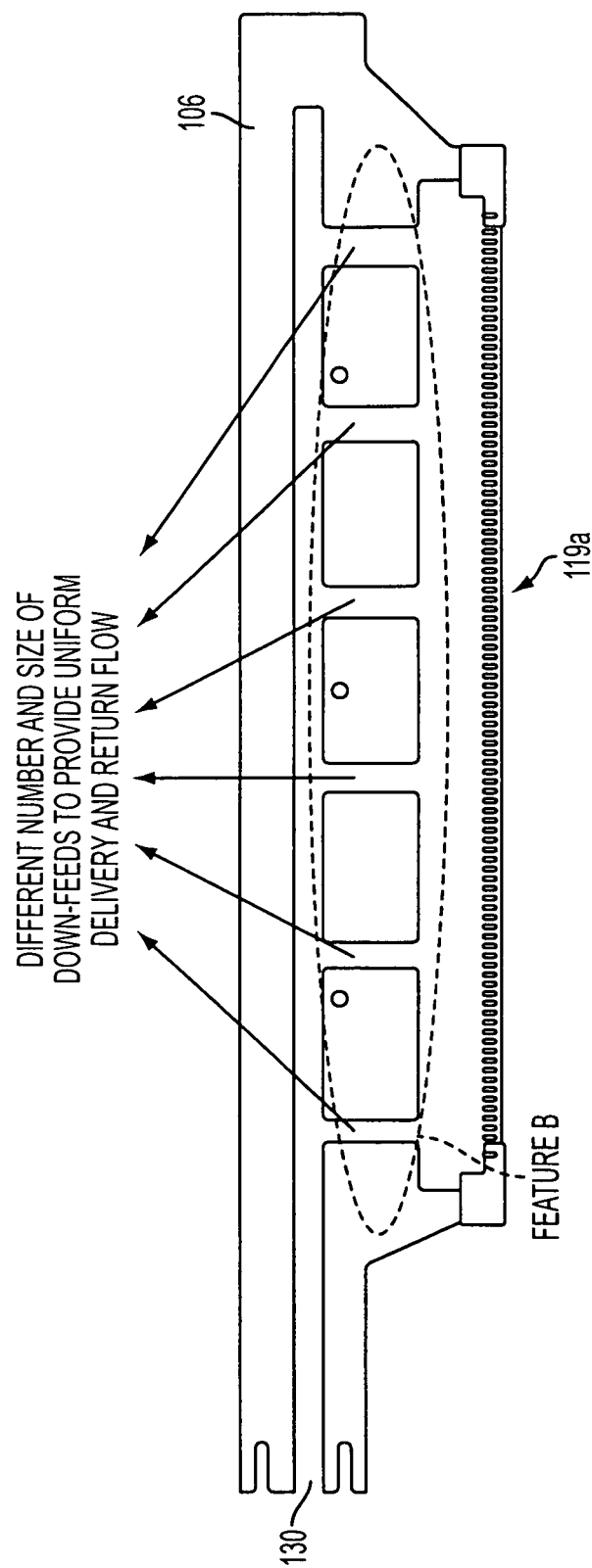
FIG. 14 is a schematic diagram illustrating the down-feeds from/to a bore in an AMC head, in accordance with an example embodiment.

FIG. 14 is a schematic diagram illustrating the down-feeds from/to a bore in an AMC head, in accordance with an example embodiment. As depicted in this figure, a bore 130 (e.g., an OR return bore) in an AMC head 106 suctions a fluid (e.g., DIW in a DIW confinement) from a meniscus through return channels 119a. As indicated in the figure, the size, number, and location of the down-feeds leading into the bore 130 from the return channels 119a have been selected so as to facilitate a uniform return flow, e.g., the down-feeds are relatively larger towards the distal end of the AMC head (e.g., the right side of the figure), which is relatively farther away from the source of the vacuum in the bore 130 (e.g., the left side of the figure). It will be appreciated that that a similar selection might be made with respect to the size, number, and location of down-feeds in delivery bores, rather than return bores. It will also be appreciated that the down-feeds shown in FIG. 14 are also depicted as Feature B in FIG. 11.

Figure 15:
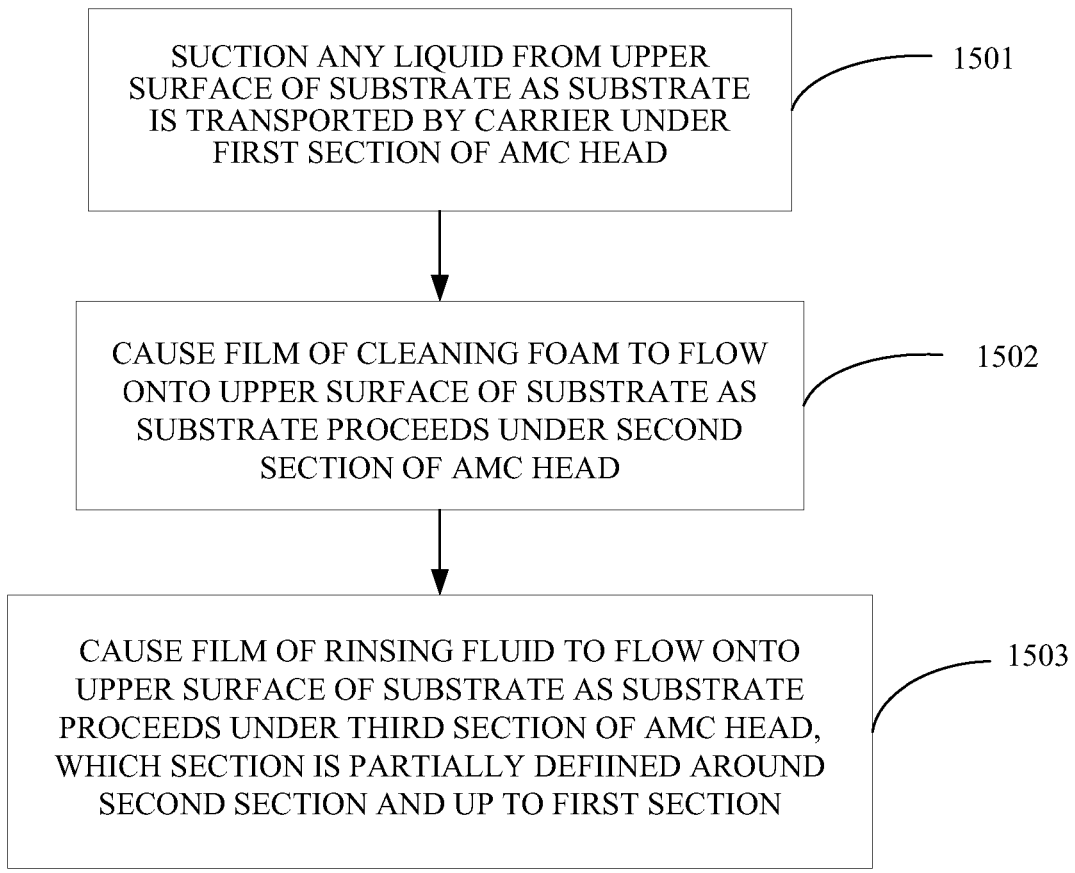
FIG. 15 is a flowchart diagram illustrating the operations in a method for confining a cleaning fluid (e.g., P3) in a linear wet system, in accordance with an example embodiment.

FIG. 15 is a flowchart diagram illustrating the operations in a method for confining a cleaning fluid (e.g., P3) in a linear wet system, in accordance with an example embodiment. In the method's first operation 1501, a linear wet system suctions any liquid remaining on the upper surface of a substrate (e.g., a semiconductor wafer) as it is transported by a carrier under the first section of an AMC head. As noted earlier, this operation might be performed by a structure for a leading edge air confinement, in an example embodiment. In the method's next operation 1502, the linear wet system causes a film (or meniscus) of cleaning foam to flow onto the upper surface of the substrate as the substrate proceeds under the second section of the AMC head. As noted earlier, this cleaning foam might be P3, in an example embodiment, which would dry into a contaminant if allowed to escape into the linear wet system's chamber. Further, this operation might be performed by a P3 zone, in an example embodiment. Then in operation 1503, the linear wet system causes a film of rinsing fluid to flow onto the upper surface of the substrate as the substrate proceeds under the third section of the AMC head, which section is partially defined around the second section and up to the first section so that the third section and the first section create a confinement of the cleaning foam in the second section. As noted earlier, this operation might be performed by a DIW confinement, in an example embodiment. Also, as noted earlier, an object of this functionality is to prevent the cleaning foam from escaping into the linear wet system's chamber.

Figure 16:
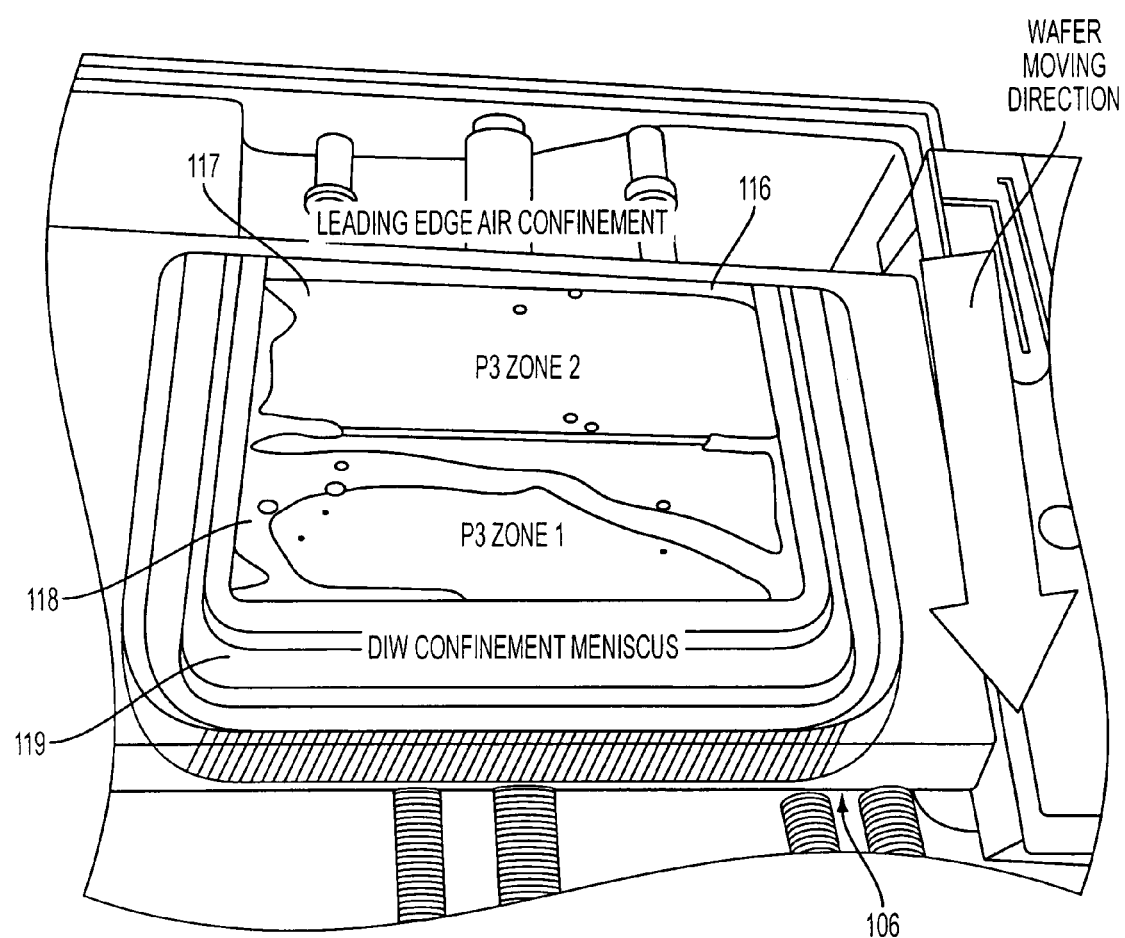
FIG. 16 is a diagram showing a confinement meniscus in an AMC head, in accordance with an example embodiment.

FIG. 16 is a figure showing a confinement meniscus in an AMC head, in accordance with an example embodiment. It will be appreciated that this figure is similar to the schematic diagram of an AMC head shown in FIG. 5. As shown in this figure, a first section 116 is the first part of the AMC head 106 encountered by a semiconductor wafer as it is carried through the linear wet system. In an example embodiment, the first section 116 suctions any fluid from the surface of the wafer and bounds the P3 meniscus which flows onto the surface of the wafer in the contiguous P3 zone 117. The AMC head 106 in FIG. 16 includes a second P3 zone 118, which also deposits and suctions P3 on the surface of the wafer. As the wafer is carried out of the second P3 zone 118, the wafer enters a DIW confinement 119, where the AMC head 106 rinses the wafer with a DIW meniscus that extends around the two P3 zones to the first section 116.

Figure 17:
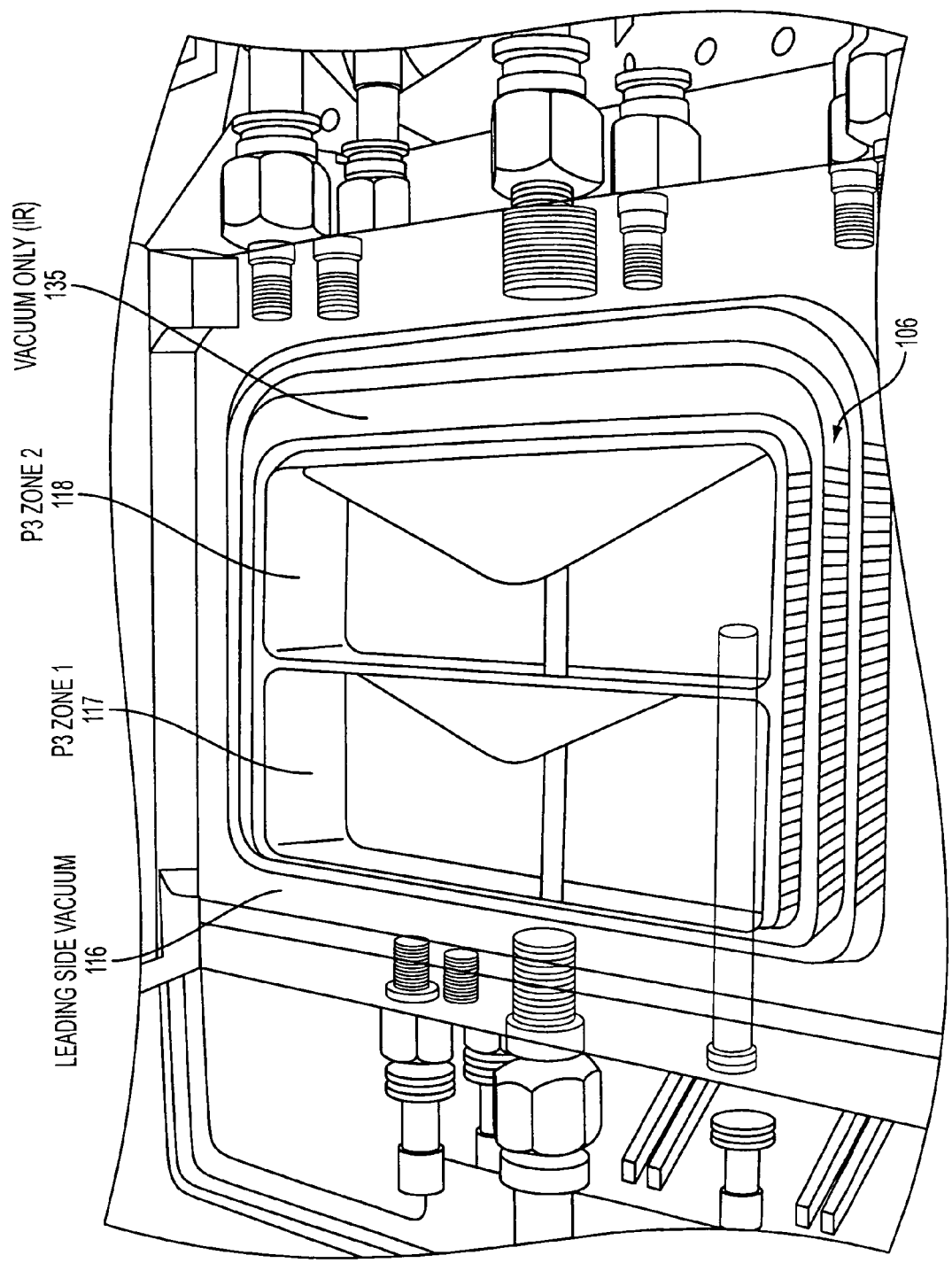
FIG. 17 is a diagram showing a vacuum confinement in an AMC head, in accordance with an alternative example embodiment.

FIG. 17 is a diagram illustrating a vacuum confinement in an AMC head, in accordance with an alternative example embodiment. As shown in this figure, a first section 116 is again the initial part of the AMC head 106 encountered by a semiconductor wafer as it is carried through the linear wet system. In an example embodiment, the first section 116 suctions any fluid from the surface of the wafer and bounds the P3 meniscus which flows onto the surface of the wafer in the contiguous P3 zone 117. The AMC head 106 in FIG. 16 includes a second P3 zone 118, which also deposits and suctions P3 on the surface of the wafer. As the wafer is carried out of the second P3 zone 118, the wafer enters a structure for an inner-return (IR) vacuum confinement 135, which extends around the two P3 zones to the first section 116. It will be appreciated that in this alternative embodiment, the AMC head 106 does not form a DIW meniscus or otherwise rinse the surface of the wafer with DIW.

Although the foregoing example embodiments have been described in some detail for purposes of clarity of understanding, it will be apparent that certain changes and modifications may be practiced within the scope of the appended claims. For example, the AMC head might confine a fluid other than a high-viscosity, non-Newtonian foam such as P3, in alternative example embodiments. Accordingly, the example embodiments are to be considered as illustrative and not restrictive, and the invention is not to be limited to the details given herein, but may be modified within the scope and equivalents of the appended claims.

What is claimed is:

1. An apparatus for processing a substrate, comprising:
    a carrier for the substrate that transports the substrate through a chamber; and
    a head, further including
        a first section that suctions liquid from the upper surface of the substrate as the substrate moves under the head,
        a second section, contiguous to the first section, that is configured to flow a film of cleaning foam onto the upper surface of the substrate as the substrate proceeds under the head, wherein the second section includes one or more input channels for delivering the film of cleaning foam and one or more output channels for removing the film of cleaning foam and wherein a group of the input channels are located below a horizontal triangular reservoir fed by a main passage above an intersection of the other two sides of the triangular reservoir; and
        a third section, contiguous to the second section, that is configured to flow a film of rinsing fluid onto the upper surface of the substrate as the substrate is carried under the head, wherein the third section is defined partially around the second section and up to the first section and wherein the third section and the first section create a confinement of the cleaning foam with respect to the chamber.

2. An apparatus as in claim 1, wherein the input and output channels are configured to cause the film of cleaning foam to flow in a radial pattern across the upper surface of the substrate.

3. An apparatus as in claim 1, wherein the cleaning foam is a non-Newtonian fluid with a viscosity in a range of about 200-2000 centipoise (cP).

4. An apparatus as in claim 1, wherein the foam comprises a liquid, a gas, and a surfactant.

5. An apparatus as in claim 1, wherein the substrate is a semiconductor wafer.

6. An apparatus as in claim 1, further comprising an additional section, contiguous to the second section included in the head, that is configured to cause a film of cleaning foam to flow onto the upper surface of the substrate as the substrate proceeds under the head, wherein the cleaning foam has a composition which differs from the cleaning foam delivered by the second section.

7. An apparatus as in claim 6, wherein the input and output channels of both the second section and the additional section are configured to cause the film of cleaning foam to flow in a sequence of radial patterns across the upper surface of the substrate.

8. An apparatus as in claim 1, wherein at least one of the sections includes a plurality of down-feeds that are sized, numbered, and located to provide uniform flow with respect to a bore in the section.

* * * * *